United States Patent
Iwabuchi

(10) Patent No.: US 6,434,017 B1
(45) Date of Patent: Aug. 13, 2002

(54) SEMICONDUCTOR DEVICE AND ELECTRONIC APPARATUS

(75) Inventor: Kaoru Iwabuchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/235,760

(22) Filed: Jan. 25, 1999

(30) Foreign Application Priority Data

Jan. 26, 1998 (JP) .............................. 10-012758

(51) Int. Cl.[7] ................................. H05K 1/03
(52) U.S. Cl. ..................... 361/771; 361/767; 361/768; 257/698; 257/778
(58) Field of Search ................. 361/760, 767, 361/768, 771, 783, 803; 257/698, 723, 724, 737, 738, 778; 438/108, 126, 127; 29/831, 832, 841; 228/180.22

(56) References Cited

U.S. PATENT DOCUMENTS

| | | | |
|---|---|---|---|
| 4,825,284 A | * 4/1989 | Soga et al. | 257/778 |
| 5,342,999 A | * 8/1994 | Frei et al. | 361/767 |
| 5,450,283 A | * 9/1995 | Lin et al. | 257/787 |
| 5,483,421 A | * 1/1996 | Gedney et al. | 361/771 |
| 5,790,384 A | * 8/1998 | Ahmad et al. | 361/767 |
| 5,926,694 A | * 7/1999 | Chigawa et al. | 438/108 |
| 5,953,814 A | * 9/1999 | Sozansky et al. | 29/841 |
| 6,002,168 A | * 12/1999 | Bellaar et al. | 257/778 |
| 6,061,248 A | * 5/2000 | Otani et al. | 257/778 |
| 6,075,710 A | * 6/2000 | Lau | 361/767 |
| 6,104,093 A | * 8/2000 | Caletka et al. | 257/778 |
| 6,111,322 A | * 8/2000 | Ando et al. | 257/778 |
| 6,163,462 A | * 12/2000 | Buck | 361/767 |
| 6,175,158 B1 | * 1/2001 | Degani et al. | 257/778 |

* cited by examiner

Primary Examiner—David L. Talbott
Assistant Examiner—John B. Vigushin
(74) Attorney, Agent, or Firm—Rader, Fishman & Grauer PLLC; Ronald P. Kananen, Esq.

(57) ABSTRACT

A semiconductor device in a chip size package form having a high durability and reliability and realizing a small size with high density, and an electronic apparatus mounting the same, connected to a motherboard by soldering, comprising a semiconductor chip wherein bumps are formed on pad portions thereof; an interposer supporting the bumps mechanically and having through-holes wherein conductors are formed and connected to the bumps electrically; and a sealing resin buried between the semiconductor chip and the interposer, wherein the interposer is formed from a material having a higher glass transition temperature than a curing temperature of the sealing resin, a coefficient of linear expansion of the interposer is of a value substantially intermediate between that of the motherboard and that of the semiconductor chip, and/or the interposer is formed from a material having a bending strength of 400 MPa or more.

10 Claims, 5 Drawing Sheets

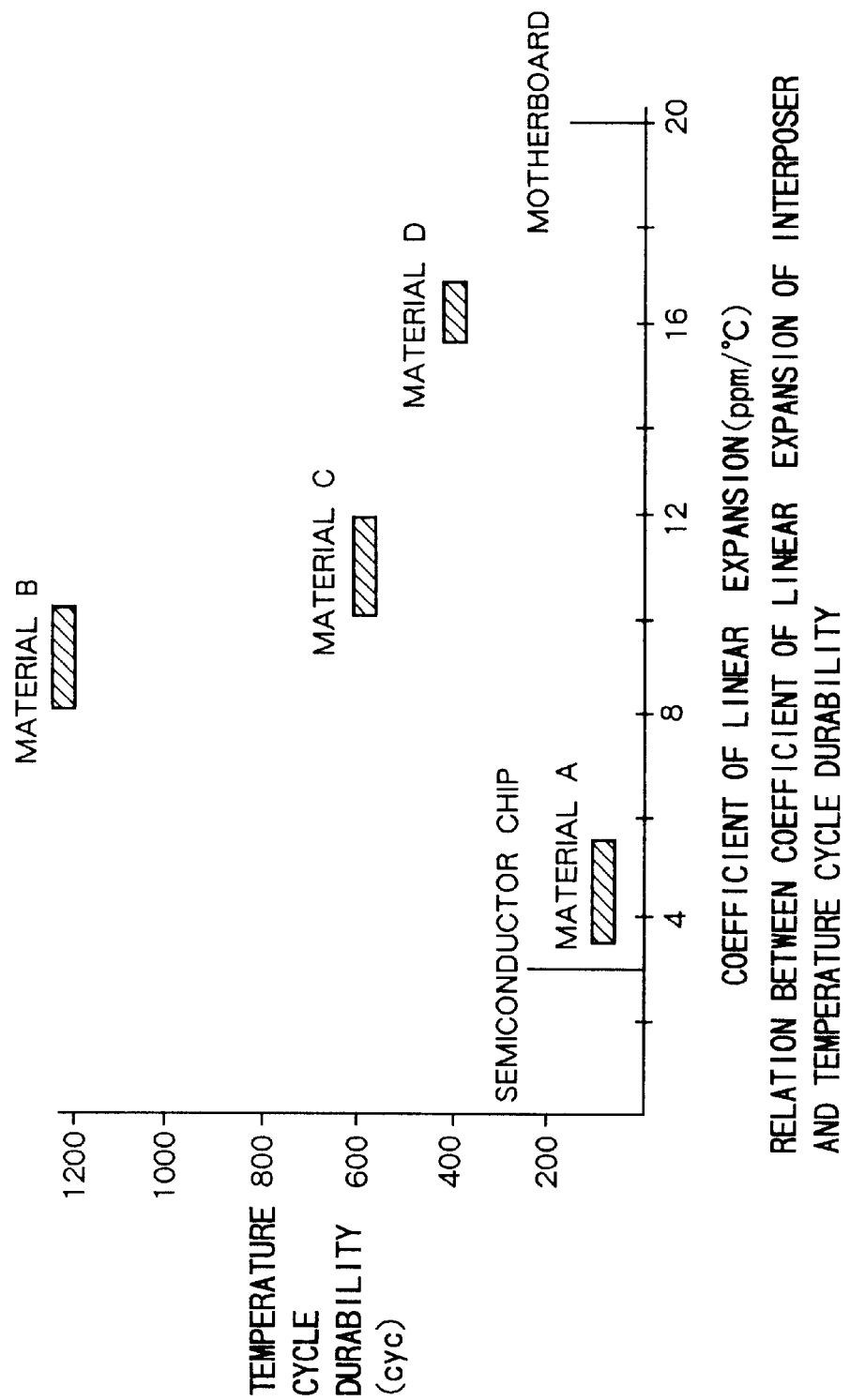

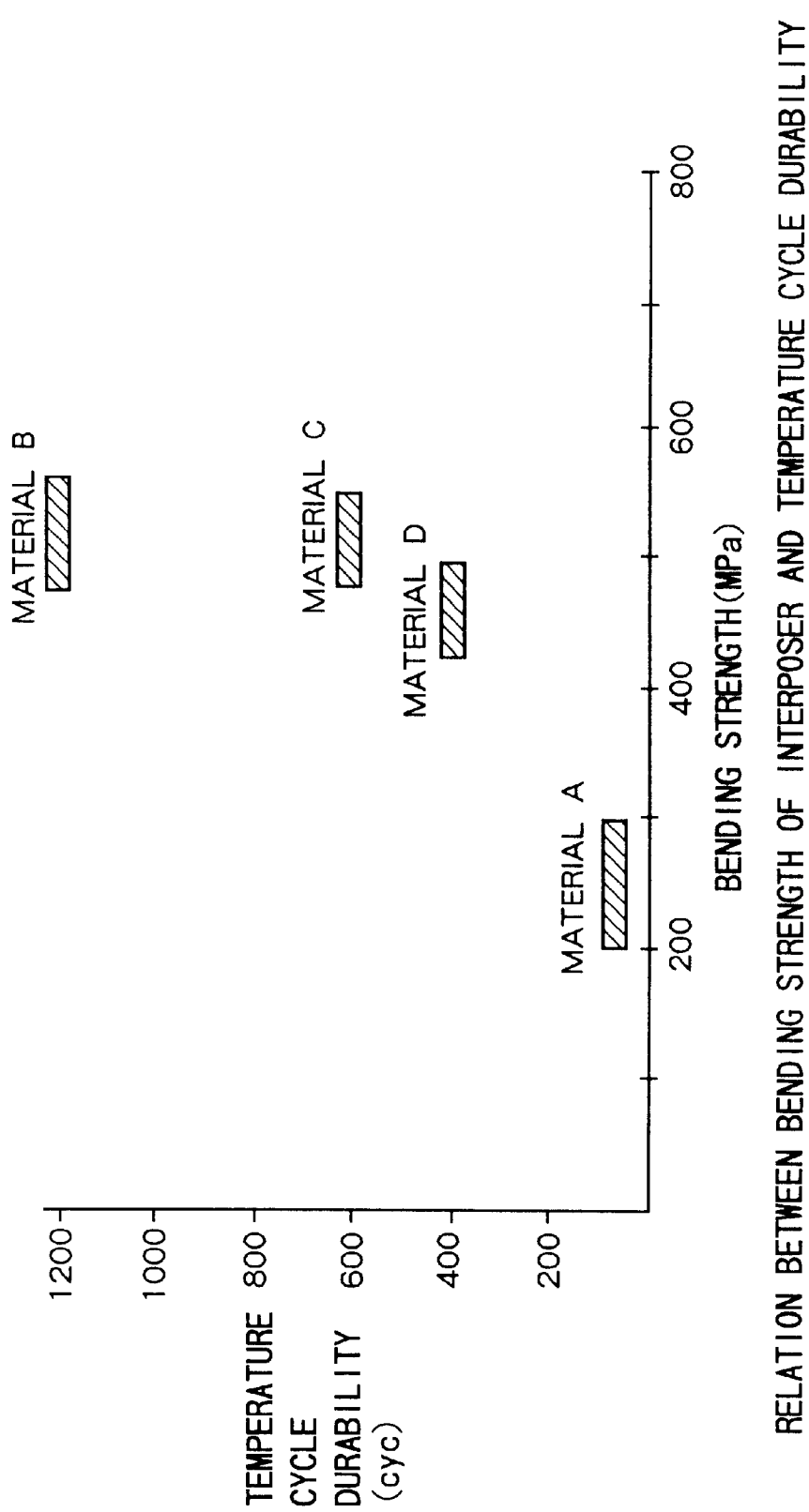

SEMICONDUCTOR DEVICE AND ELECTRONIC APPARATUS

BACKGROUND OF THE INVENTION

1. Field of the Invention

The present invention relates to a semiconductor device and an electronic apparatus mounting the same, more specifically relates to a semiconductor device in a packaged form which is small in size and high in integration density and an electronic apparatus mounting the same.

2. Description of the Related Art

In recent semiconductor devices such as very large sized integrated circuits (VLSIs), a 70% reduction of the size has been realized in three years and both higher integration and higher performance have been achieved. Along with this, package forms of semiconductor devices have also been made smaller and higher in density.

As forms of packages of semiconductor devices, dual in-line packages (DIP), pin grid arrays (PGA), and other through-hole mount device types (THD) wherein lead lines are inserted in through-holes formed on a printed substrate and quad flat (L-leaded) packages (QFP), tape carrier packages (TCP), and other surface mount device types (SMD) wherein lead lines are soldered on the surface of the substrate have been used. Further, there has been a shift to packages such as ball grid arrays (BGA) wherein the output terminals are arranged in two-dimensional areas.

On the other hand, demands for smaller sized and higher density semiconductor are still escalating and it is becoming impossible to meet the demands with the above QFP and other packages. Therefore, attention has been drawn to packages called chip size packages (CSP) which achieve even smaller and higher density semiconductor devices by making the size of the package as close as possible to a semiconductor chip. Considerable research is now underway and many proposals are being made.

In the above CSP, for example, as shown in the cross-sectional view of FIG. 1, a semiconductor chip 1 is mechanically and electrically connected to an interposer 2 at bumps 4. The area between the semiconductor chip 1 and the interposer 2 is filled with sealing resin 3. Terminals 5 formed in an array on the other side of the interposer 2 are electrically connected with the bumps 4 through through-holes 7 formed in the interposer 2. The terminals 5 are soldered as output terminals to a not-illustrated motherboard made from, for example, a glass epoxy based material.

In the above CSP, however, warpage sometimes occurs after the various heat processing steps in the manufacturing process. For example, when packaging a semiconductor chip of 10 mm square size, the coplanarity (maximum value of distance of terminal from plane when placing package on plane) reaches 30 μm in some cases.

In order to prevent the above warpage, there is known a method to use an interposer made of a ceramic, however, the high price of ceramics becomes a factor in higher manufacturing costs and there is also a problem in durability and reliability. For example, in temperature cycle experiments giving 72 cycles of temperature change from −25 to 125° C. a day, cracks (joint destruction) end up occurring at solder joint portions after about 100 cycles. Therefore, the durability is too short for practical use.

SUMMARY OF THE INVENTION

An object of the present invention is to provide a semiconductor device in a chip size package realizing a smaller size and higher density and having high durability and reliability and an electronic apparatus mounting the same.

To attain the above object, according to a first aspect of the present invention, there is provided a semiconductor device packaged and connected to a motherboard by soldering, comprising a semiconductor chip wherein a bump is formed on a pad portion thereof; an interposer supporting the bump mechanically and having a through-hole wherein a conductor is formed and connected to the bump electrically; and a sealing resin buried between the semiconductor chip and the interposer; the interposer being formed from a material having a glass transition temperature higher than a curing temperature of the sealing resin.

Here, the "glass transition temperature" is the point where a material comprised of an organic material etc. changes from a hard glass-like state to a soft rubber-like state. Note that if this change occurs under pressure, it is impossible to maintain the hardness so deformation occurs.

According to the semiconductor device of the present invention, since the smaller size and higher density chip size package has an interposer formed from a material having a higher glass transition temperature than a curing temperature of the sealing resin, it is possible to carry out heat processing for curing the sealing resin at a lower temperature than the glass transition temperature of the interposer material. Therefore, it is possible to package a semiconductor device without such a glass transition of the interposer material, that is, without deforming the interposer. As a result, the durability and reliability can be improved.

According to a second aspect of the present invention, there is provided a semiconductor device packaged and connected to a motherboard, comprising a semiconductor chip wherein a bump is formed on a pad portion thereof; an interposer supporting the bump mechanically and having a through-hole wherein a conductor is formed and connected to the bump electrically; and a sealing resin buried between the semiconductor chip and the interposer; a coefficient of linear expansion of the interposer being a value substantially intermediate between those of the motherboard and the semiconductor chip.

According to the above semiconductor device, since the smaller size and higher density chip size package has a coefficient of linear expansion of the interposer of a value substantially between that of the motherboard and that of the semiconductor chip, it is possible to interfere with the stress caused by the difference between the expansion and contraction of the motherboard and the semiconductor chip in the heat processing steps in the manufacturing process or the difference between the expansion and contraction of the motherboard and the semiconductor chip caused by the heating of the device when used as a semiconductor device. As a result, joint destruction can be suppressed and durability and reliability can be improved.

According to a third aspect of the present invention, there is provided a semiconductor device packaged and connected to a motherboard, comprising a semiconductor chip wherein a bump is formed on a pad portion thereof; an interposer supporting the bump mechanically and having a through-hole wherein a conductor is formed and connected to the bump electrically; and a sealing resin buried between the semiconductor chip and the interposer; the interposer being formed from material having a bending strength of 400 MPa or more.

According to the above semiconductor device, since the smaller size and higher density chip size package has an interposer made from material having a bending strength of 400 MPa or more, it is possible to interfere with the stress caused by the difference between the expansion and contraction of the motherboard and the semiconductor chip caused by heating of the device when used as a semiconductor device. As a result, the durability and reliability can be improved.

Also, the semiconductor device of the present invention can improve the durability and reliability by combining the characteristics of the formation of the interposer by a material having a higher glass transition temperature than a curing temperature of sealing resin, the coefficient of linear expansion of the interposer being a value substantially intermediate between that of the motherboard and that of the semiconductor chip, and the interposer being made from a material having a bending strength of 400 MPa or more.

According to a fourth aspect of the present invention, there is provided an electronic apparatus comprising a motherboard on which an electrode is formed; a semiconductor chip wherein a bump is formed on the pad portion thereof; an interposer supporting the bump mechanically and having a through-hole wherein a conductor is formed and connected to the bump electrically; and a sealing resin buried between the semiconductor chip and the interposer; the interposer being formed from a material having a glass transition temperature higher than a curing temperature of the sealing resin; and the through-hole connected electrically to a corresponding electrode of the motherboard by solder.

Preferably, a coefficient of linear expansion of the interposer is of a value substantially intermediate between those of the motherboard and the semiconductor chip.

Preferably, the interposer is formed from a material having a bending strength of 400 MPa or more.

In the electronic apparatus of the present invention, since the interposer of the smaller size and higher density chip size package is formed by a material having a higher glass transition temperature than the curing temperature of the sealing resin, the heat processing for curing the sealing resin in the manufacturing process can be carried out at a lower temperature than the glass transition temperature of the interposer material. Namely, this electronic apparatus mounts a semiconductor device capable of being packaged without glass transition of the interposer material, that is, without deformation of the interposer, and therefore can be improved in durability and reliability.

BRIEF DESCRIPTION OF THE DRAWINGS

The above and other objects and features of the present invention will become clearer from the following description of the preferred embodiments given with reference to the accompanying drawings, in which:

FIG. 5 is a graph of results of a temperature cycle experiment according to a second embodiment of the present invention; and FIG. 6 is a graph of results of a temperature cycle experiment according to a third embodiment of the present invention.

DESCRIPTION OF THE PREFERRED EMBODIMENTS

Below, preferred embodiments will be described with reference to the accompanying drawings.

First Embodiment

Figure 1:
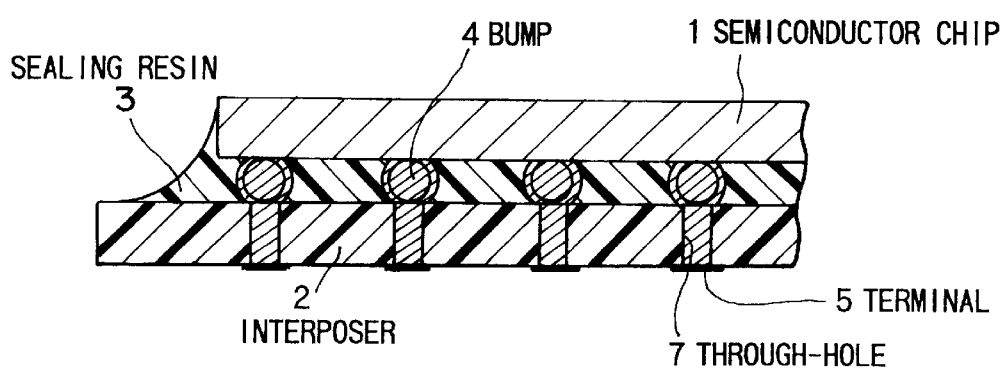
FIG. 1 is a cross-sectional view of a semiconductor device according to the related art.
Figure 2:
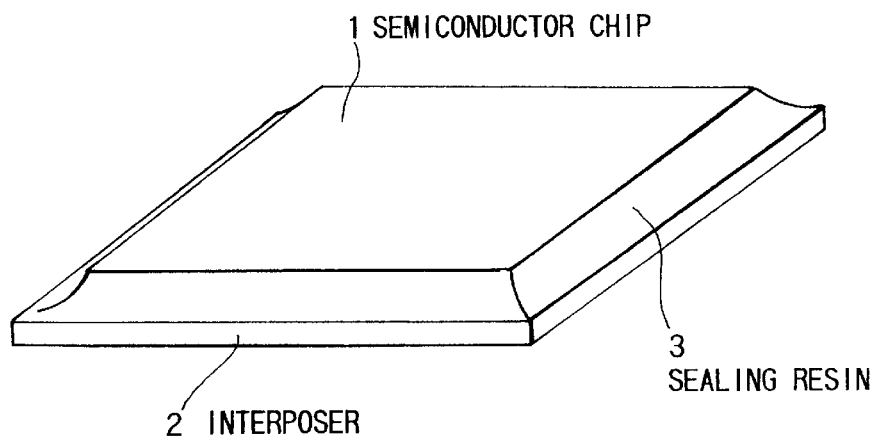
FIG. 2 is a perspective view of a semiconductor device according to a first embodiment of the present invention.

First, a semiconductor device of a first embodiment of the present invention will be explained. FIG. 2 is a schematic perspective view of a semiconductor device according to the first embodiment. A semiconductor chip 1 is mounted on an interposer 2 and sealed by sealing resin 3.

Figure 3:
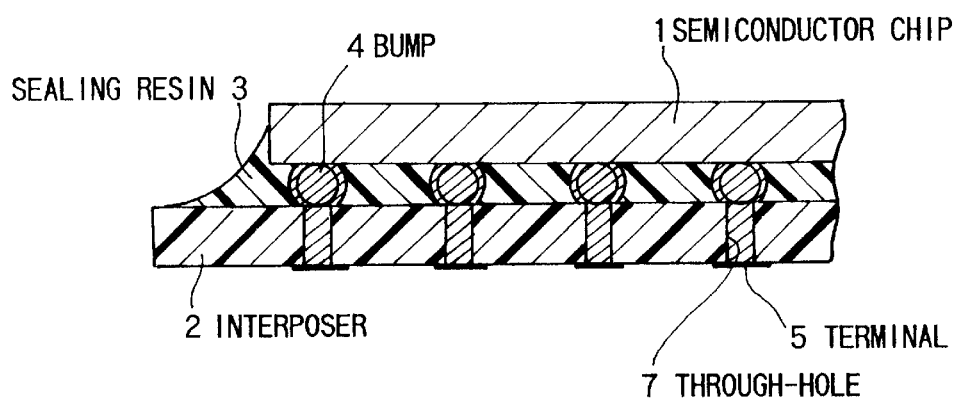
FIG. 3 is a cross-sectional view of a semiconductor device according to the first embodiment.

FIG. 3 is a cross-sectional view of a semiconductor device according to the first embodiment. The semiconductor chip 1 is mechanically and electrically connected to the interposer 2 at bumps 4. The area between the semiconductor chip 1 and the interposer 2 is filled with the sealing resin 3. Terminals 5 provided in an array on the other side of the interposer 2 are electrically connected with the bumps 4 through through-holes 7 formed in the interposer 2. The terminals 5 are soldered as output terminals to a not illustrated motherboard made of, for example, a glass epoxy based material.

The interposer 2 of the above semiconductor device is formed from a material having a glass transition temperature higher than the curing temperature of the sealing resin 3, is formed so as to have a coefficient of linear expansion of a value substantially intermediate between that of the motherboard and that of the semiconductor chip 1, and/or is formed from a material having a bending strength of 400 MPa or more. For example, an epoxy based resin, glass epoxy based resin, epoxy polyphenol based resin, polyphenylether based resin, etc. can be used.

The above semiconductor device is a smaller size and higher density chip size package. Also, the semiconductor device can be improved in durability and reliability because, for example, the package is made without deformation of the interposer or without joint destruction by interfering with the stress caused by the difference between expansion and contraction of the motherboard and the semiconductor chip due to heating of the device when used as a semiconductor device. Also, when the semiconductor device is made from a material having a bending strength of 400 MPa or more, the coplanarity after assembly of the semiconductor device can be kept small.

The process for manufacturing the above semiconductor device will be explained next. For example, bumps 4 made of soldering balls are formed at pad portions on the semiconductor chip 1 formed by integrating a variety of semiconductor elements such as transistors on a substrate. On the other hand, conductors are formed at the through-holes 7 formed, for example, in an array. A circuit pattern is printed to connect to the conductors in the through-holes 7, if necessary, and the interposer 2 is formed. The conductors in the through-holes 7 or the circuit pattern are flux processed, then the conductors in the through-holes 7 are aligned in position with the bumps 4 and the two are brought into contact. Then, the bumps 4 are melted by heating processing of, for example, about 220° C., then cooled to mechanically and electrically connect the semiconductor chip 1 and the interposer 2. Next, the sealing resin 3, for example, made from a material which cures in the heat processing at about 120° C. to 150° C., is filled between the semiconductor 1 and the interposer 2 and cured for sealing. The thus packaged semiconductor device is then soldered on the glass epoxy based motherboard for use.

At the time of solidification of the sealing resin 3, in the related art, the interposer 2 was deformed due to the heat from the sealing resin 3 and warpage occurred which sometimes generated stress to cause joint destruction at bump joint portions. In the first embodiment, on the other hand, warpage can be prevented by, for example, forming the interposer 2 from an organic material having a higher glass transition temperature than the curing temperature of the sealing resin 3.

Figure 4:
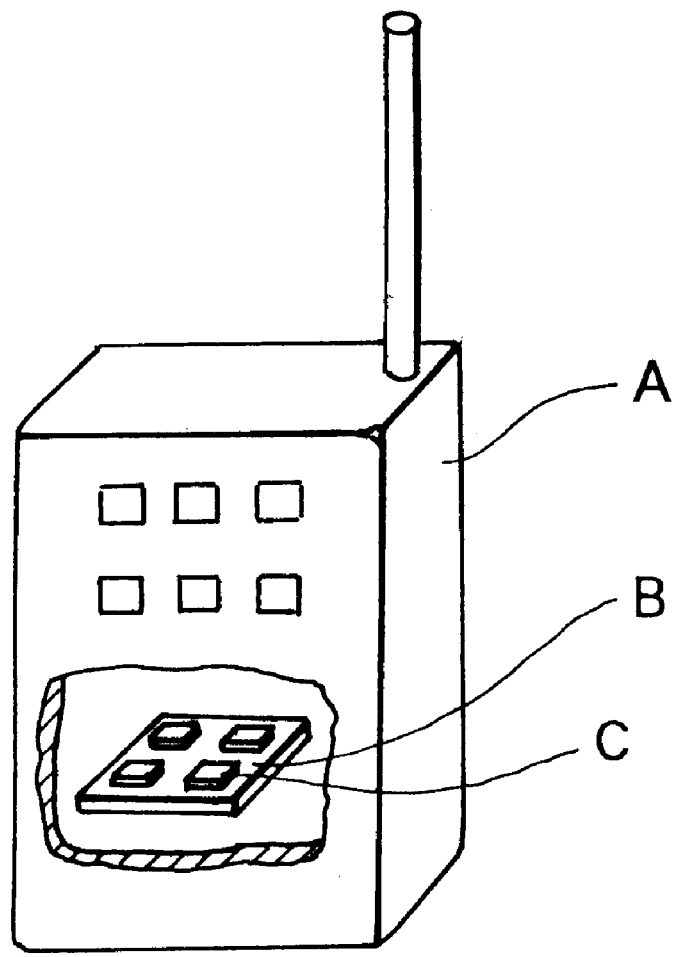
FIG. 4 is an explanatory view of the configuration of an example of an electronic apparatus mounting a semiconductor device according to the first embodiment.

FIG. 4 is an explanatory view of the configuration of an electronic apparatus mounting a semiconductor device according to the present invention.

As shown in the figure, the electronic apparatus A is a cellular phone carrying a motherboard B on which terminals (not illustrated) of a semiconductor device C according to the present invention are soldered in correspondence with electrodes (not illustrated) on the motherboard B.

By using the smaller size, higher density, high durability, and high reliability semiconductor device according to the present invention, it becomes possible to realize a high durability and high reliability electronic apparatus having a further smaller size and higher density.

In the first embodiment, the semiconductor device was formed by connecting the semiconductor chip to the package using an interposer made from an organic material having a glass transition temperature of 120° C. or 160° C. and by sealing it with sealing resin having a melting temperature of 120° C. or 150° C. A temperature cycle experiment giving 72 cycles of temperature change from −25° C. to 125° C. a day was carried out on the obtained semiconductor device to study the average durability until occurrence of cracks (joint destruction). The results are shown in Table 1.

TABLE 1

| Glass transition temperature of interposer | Highest curing temperature of sealing resin | |
|---|---|---|
| | 120° C. | 150° C. |
| 120° C. | 400 cyc. | 200 cyc. |
| 160° C. | 600 cyc. | 600 cyc. |

As shown in Table 1, by using an organic material having a higher glass transition temperature than the curing temperature of the sealing resin for the interposer, it is possible to extend the average durability in the temperature cycle experiment. Therefore, the durability and reliability of the semiconductor device can be improved.

Second Embodiment

In the semiconductor device of the second embodiment of the present invention, use was made of an interposer of materials having different coefficients of linear expansion, for example, a ceramic based material having a coefficient of linear expansion of about 4 ppm/° C. (material A), an epoxy based material having a coefficient of about 10 ppm/° C. (material B), an epoxy based material having a coefficient of about 12 ppm/° C. (material C), and an epoxy based material having a coefficient of about 16 ppm/° C. (material D). The coefficient of linear expansion of the semiconductor chip is about 3 ppm/° C. and that of the motherboard (glass epoxy material) is about 20 ppm/° C. A temperature cycle experiment giving 72 cycles of temperature change from −25° C. to 125° C. a day was carried out in the same way as in the first embodiment to find the average durability until cracks (joint destruction). The results are shown in FIG. 5.

As shown in FIG. 5, the average durability in the temperature cycle experiment can be extended by the fact that the coefficient of linear expansion of the interposer is a value substantially intermediate between that of the motherboard and the semiconductor chip. Therefore, the durability and reliability of the semiconductor device can be improved.

Third Embodiment

In the semiconductor device of the third embodiment of the present invention, use was made of an interposer made of materials having different bending strengths, for example, an alumina ceramic ($Al_2O_3$) based material having a bending strength of about 250 MPa (material A), an epoxy polyphenol based resin material having a strength of about 500 MPa (material B), a polyphenylether based material having a strength of about 500 MPa (material C), or a glass epoxy based material having a strength of about 450 MPa (material D). A temperature cycle experiment giving 72 cycles of temperature change from −25° C. to 125° C. a day was carried out in the same way as in the first embodiment to find the average durability until cracks (joint destruction). The results are shown in FIG. 6.

As shown in FIG. 6, the average durability in the temperature cycle experiment can be extended by using a material having a bending strength of 400 MPa or more, and the durability and reliability of the semiconductor device can be improved.

Fourth Embodiment

In the semiconductor device of the fourth embodiment, the package size was 10 mm square, the size of the semiconductor chip was 9 mm square, the interval between the semiconductor chip and the interposer was 0.5 mm, the number of pins was 232, the interposer was made from an epoxy polyphenol based resin material (product of Hitachi Kasei (MCL-E-679)), the sealing resin was a product of Matsushita Denko (CV5186S), and the curing was conducted at 100° C. for one hour and 150° C. for three hours. The obtained semiconductor device was connected to a motherboard (FR-4 (four-layer type substrate), thickness of 0.7 mm). A variety of durability experiments shown in Table 2 were carried out on the obtained semiconductor device. The results are shown in Table 2.

TABLE 2

| Type of durability experiment | Test conditions | Test time (cycles) | No. of destructions (out of 45) |
|---|---|---|---|
| Temperature cycle | −25° C. to 125° C., 72 cycles/day | 2000 cycles | 0/45 |
| High temperature, high humidity bias experiment | 85° C./85% 5.0 V | 1000 hours | 0/45 |
| Experiment of high temperature operation | 120° C., 5.0 V | 1000 hours | 0/45 |
| Pressure cooker experiment | 110° C., 85% RH | 750 hours | 0/45 |

As shown in Table 2, it was confirmed that the semiconductor device of the present embodiment has high durability and high reliability.

The present invention can be applied to any semiconductor device such as a MOS transistor type semiconductor device, a bipolar type semiconductor device, a BiMOS type semiconductor device, and a semiconductor device mounting a logic and memory.

While the invention has been described with reference to specific embodiments chosen for purpose of illustration, it should be apparent that numerous further modifications could be made thereto by those skilled in the art without departing from the basic concept and scope of the invention.

For example, the material of the interposer is not limited to the materials listed in the embodiments as far as it has the above physical characteristics. Also, the sealing resin material is not limited to the materials listed in the embodiments.

Summarizing the effects of the invention, as explained above, according to the present invention, it is possible to provide a semiconductor device in a form of a chip size package having a high durability and high reliability and realizing a small size and high density and an electronic apparatus mounting the same.

What is claimed is:

1. A semiconductor device packaged and connected to a motherboard by soldering, comprising:

a semiconductor chip wherein a bump is formed on a pad portion thereof;

an interposer supporting the bump mechanically and having a through-hole wherein a conductor is formed and connected to the bump electrically; and a sealing resin buried between the semiconductor chip and the interposer;

the interposer being formed from a material having a glass transition temperature higher than a curing temperature of the sealing resin, wherein the interposer is formed from a material having a bending strength of 400 Mpa or more.

2. A semiconductor device as set forth in claim 1, wherein a coefficient of linear expansion of the interposer is of a value substantially intermediate between those of the motherboard and the semiconductor chip.

3. A semiconductor device as set for the in claim 1, wherein the motherboard is made of a glass epoxy based material.

4. A semiconductor device as set forth in claim 1, wherein the interposer is made of an organic material.

5. A semiconductor device packaged and connected to a motherboard, comprising:

a semiconductor chip wherein a bump is formed on a pad portion thereof;

an interposer supporting the bump mechanically and having a through-hole wherein a conductor is formed and connected to the bump electrically; and a sealing resin buried between the semiconductor chip and the interposer;

a coefficient of linear expansion of the interposer being a value substantially intermediate between those of the motherboard and the semiconductor chip.

6. A semiconductor device as set forth in claim 5, wherein the interposer is formed form material having a bending strength of 400 MPa or more.

7. A semiconductor device as set forth in claim 5, wherein the motherboard is made of a glass epoxy based material.

8. A semiconductor device as set forth in claim 5, wherein the interposer is made of an organic material.

9. An electric apparatus comprising:

a motherboard on which an electrode is formed;

a semiconductor chip wherein a bump is formed on the pad portion thereof;

an interposer supporting the bump mechanically and having a through-hole wherein a conductor is formed and connected to the bump electrically; and a sealing resin buried between the semiconductor chip and the interposer;

the interposer being formed from a material having a glass transition temperature higher than a curing temperature of the sealing resin; and the through-hole connected electrically to a corresponding electrode of the motherboard by solder, wherein a coefficient of linear expansion of the interposer is of a value substantially intermediate between those of the motherboard and the semiconductor chip.

10. An electronic apparatus as set forth in claim 9, wherein the interposer is formed from a material having a bending strength of 400 MPa or more.

* * * * *